(12) United States Patent
Wang et al.

(10) Patent No.: US 10,475,865 B2
(45) Date of Patent: Nov. 12, 2019

(54) FLEXIBLE DISPLAY SUBSTRATE AND MANUFACTURING METHOD THEREOF, AND FLEXIBLE DISPLAY MOTHERBOARD

(71) Applicants: BOE Technology Group Co., Ltd., Beijing (CN); Hefei Xinsheng Optoelectronics Technology Co., Ltd., Anhui (CN)

(72) Inventors: Xinxin Wang, Beijing (CN); Zhijie Ye, Beijing (CN); Wenbin Jia, Beijing (CN); Ronggang Shangguan, Beijing (CN); Lingyun Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/843,455

(22) Filed: Dec. 15, 2017

(65) Prior Publication Data

US 2018/0308911 A1    Oct. 25, 2018

(30) Foreign Application Priority Data

Apr. 21, 2017    (CN) .......................... 2017 1 0265370

(51) Int. Cl.
*H01L 27/32*    (2006.01)
*H01L 41/18*    (2006.01)
(Continued)

(52) U.S. Cl.
CPC .......... *H01L 27/3244* (2013.01); *H01L 41/18* (2013.01); *H01L 51/003* (2013.01);
(Continued)

(58) Field of Classification Search
CPC ..................................................... H01L 41/18
See application file for complete search history.

(56) References Cited

U.S. PATENT DOCUMENTS

| | | | | |
|---|---|---|---|---|
| 2006/0105152 A1* | 5/2006 | Cok | ...................... | G06F 3/0414 |
| | | | | 428/209 |
| 2016/0066445 A1* | 3/2016 | Park | ....................... | H01L 51/52 |
| | | | | 361/749 |
| 2017/0062717 A1* | 3/2017 | Khachatryan | ......... | H01L 51/003 |

FOREIGN PATENT DOCUMENTS

| | | |
|---|---|---|
| CN | 104465475 A | 3/2015 |
| CN | 104698631 A | 6/2015 |
| KR | 1020120054391 | 5/2012 |

OTHER PUBLICATIONS

First Office Action dated Apr. 22, 2019 corresponding to Chinese application No. 201710265370.1.

* cited by examiner

*Primary Examiner* — Moazzam Hossain
*Assistant Examiner* — Omar F Mojaddedi
(74) *Attorney, Agent, or Firm* — Nath, Goldberg & Meyer; Joshua B. Goldberg

(57) ABSTRACT

A flexible display substrate, a method for manufacturing the same and a flexible display motherboard are provided in the present disclosure. The flexible display motherboard includes a carrier substrate, a separation layer provided above the carrier substrate, a deformable layer covering the separation layer, a flexible substrate provided above the deformable layer, and a display device provided on the flexible substrate, wherein the deformable layer shrinks and deforms under a preset triggering condition to separate the flexible substrate from the carrier substrate without any damage to the display element, and the light-outgoing effect of the flexible display device can be improved.

20 Claims, 2 Drawing Sheets

(51) Int. Cl.
*H01L 51/52* (2006.01)
*H01L 51/00* (2006.01)
*H01L 41/193* (2006.01)

(52) U.S. Cl.
CPC ........ *H01L 51/0097* (2013.01); *H01L 41/193* (2013.01); *H01L 2227/323* (2013.01)

US 10,475,865 B2

FLEXIBLE DISPLAY SUBSTRATE AND MANUFACTURING METHOD THEREOF, AND FLEXIBLE DISPLAY MOTHERBOARD

CROSS-REFERENCE TO RELATED APPLICATIONS

The present disclosure claims the priority of Chinese Patent Application No. 201710265370.1, filed on Apr. 21, 2017, the contents of which are incorporated herein in its entirety by reference.

TECHNICAL FIELD

The present disclosure relates to the field of display technology, and in particular, to a flexible display substrate, a method for manufacturing the same, and a flexible display motherboard.

BACKGROUND

With the development of Organic Light-Emitting Diode (OLED) technology, flexible OLED display devices have been extensively studied due to their advantages such as flexibility and portability, and have become main in the field of display technology. Among the various flexible OLED display technology, the separation of the flexible substrate from the carrier substrate without destroying the display elements is a key technology in the preparation of flexible OLED display devices.

SUMMARY

The present disclosure provides a flexible display substrate, a method for manufacturing the same, and a flexible display motherboard.

In an aspect of the disclosure, a method for manufacturing a flexible display substrate is provided, the method includes: forming a separation layer above a carrier substrate; forming a deformable layer on the separation layer; forming a flexible substrate above the deformable layer; forming a display device on the flexible substrate; and causing the deformable layer to shrink and deform under a preset triggering condition to separate the flexible substrate from the carrier substrate.

Optionally, a material of the deformable layer is a piezoelectric deformable material, and wherein, the step of forming the separation layer above the carrier substrate includes: forming a first conductive layer on the carrier substrate; and forming the separation layer on the first conductive layer. The step of forming the flexible substrate above the deformable layer includes: forming a second conductive layer on the deformable layer; and forming the flexible substrate on the second conductive layer. The step of causing the deformable layer to shrink and deform under the preset triggering condition includes: causing the deformable layer to shrink and deform by applying a preset voltage difference between the first conductive layer and the second conductive layer.

Optionally, the piezoelectric deformable material is polyvinylidene fluoride.

Optionally, the preset voltage difference ranges from 10V to 30V.

Optionally, a material of the deformable layer is a temperature deformable material, and wherein the step of causing the deformable layer to shrink and deform under the preset triggering condition includes: causing the deformable layer to shrink and deform at a preset temperature.

Optionally, the temperature deformable material is $Sc_2W_3O_{12}$, $Mn_3ZnN$ or $ZrW_2O_8$.

Optionally, the preset temperature ranges from −263° C. to 927° C.

Optionally, the separation layer includes a plurality of particles.

Optionally, a material of the plurality of particles is metal or polystyrene.

In an aspect of the disclosure, a flexible display substrate manufactured by the above method for manufacturing the flexible display substrate is provided, the flexible display substrate includes: a flexible substrate including a first surface and a second surface opposite to each other; a display device provided on the first surface of the flexible substrate; a deformable layer provided on the second surface of the flexible substrate; and a separation layer provided in the deformable layer, wherein the deformable layer is configured to shrink and deform under a preset triggering condition.

Optionally, the flexible display substrate further includes a first conductive layer provided on the separation layer, and a second conductive layer provided between the flexible substrate and the deformable layer, wherein a material of the deformable layer is a piezoelectric deformable material, and the deformable layer shrinks and deforms when a preset voltage difference is applied between the first conductive layer and the second conductive layer.

Optionally, the piezoelectric deformable material is polyvinylidene fluoride.

Optionally, a material of the deformable layer is a temperature deformable material, and the deformable layer shrinks and deforms at a preset temperature.

Optionally, the temperature deformable material is $Sc_2W_3O_{12}$, $Mn_3ZnN$ or $ZrW_2O_8$.

Optionally, the separation layer includes a plurality of particles.

Optionally, a material of the plurality of particles is metal or polystyrene.

Optionally, each of the plurality of particles is spherical.

In an aspect of the disclosure, a flexible display motherboard is provided, the flexible display motherboard includes a carrier substrate, a separation layer provided above the carrier substrate, a deformable layer covering the separation layer, a flexible substrate provided above the deformable layer, and a display device provided on the flexible substrate, wherein the deformable layer shrinks and deforms under a preset triggering condition to separate the flexible substrate from the carrier substrate.

Optionally, the flexible display motherboard further includes a first conductive layer provided between the carrier substrate and the separation layer; and a second conductive layer provided between the flexible substrate and the deformable layer, wherein a material of the deformable layer Is a piezoelectric deformable material, and the deformable layer shrinks and deforms when a preset voltage difference is applied between the first conductive layer and the second conductive layer.

Optionally, a material of the deformable layer is a temperature deformable material, and the deformable layer shrinks and deforms at a preset temperature.

DETAILED DESCRIPTION

In order to enable those skilled in the art to better understand the disclosure, a flexible display motherboard, a flexible display substrate and a manufacturing method thereof according to the present disclosure are described in detail below with reference to the accompanying drawings.

Currently, a flexible display substrate is manufactured by first on a carrier substrate, forming a separation layer, a flexible substrate, and a display element on the flexible substrate, and then separating the flexible substrate from the carrier substrate by using a method such as laser lift-off technique or resistor heating lift-off technique, or by using a chemical method. However, a high temperature generated by laser lift-off technique or resistor heating lift-off technique can damage the display element, and the chemical separation method can corrode the display element, thereby reducing the lifetime of the display element.

Figure 1:
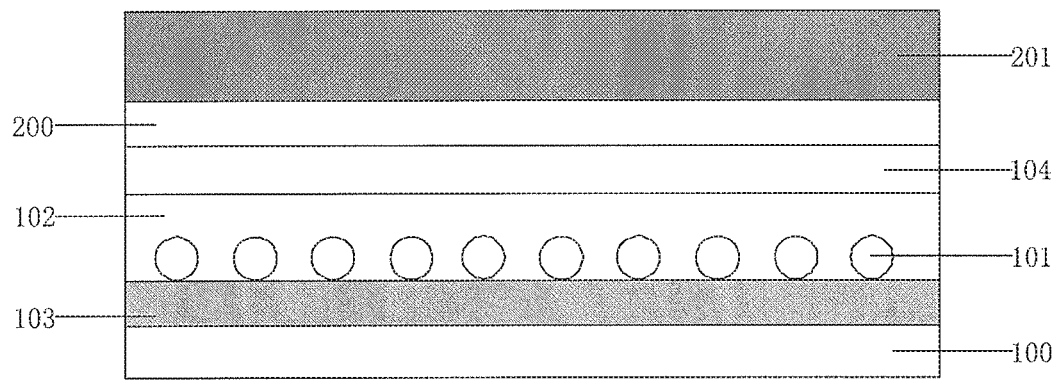
FIG. 1 is a schematic diagram of a structure of a flexible display motherboard according to an embodiment of the present disclosure.

FIG. 1 is a schematic diagram of a structure of a flexible display motherboard according to an embodiment of the present disclosure. As shown in FIG. 1, the flexible display motherboard includes a carrier substrate 100, a separation layer 101 provided above the carrier substrate 100, a deformable layer 102 covering the separation layer 101, a flexible substrate 200 provided above the deformable layer 102, and a display device 201 provided on the flexible substrate 200, wherein the deformable layer 102 shrinks and deforms under a preset triggering condition to separate the flexible substrate 200 from the carrier substrate 100. In this embodiment, the flexible substrate 200 can be separated from the carrier substrate 100 easily and conveniently without any damage to the display element, and the light-outgoing effect of the flexible display device can also be improved.

In this embodiment, the separation layer 101 includes a plurality of particles. A shape of the particle in the separation layer 101 may be any shape as long as such a shape can separate the flexible substrate 200 from the carrier substrate. Optionally, the shape of the particle may be spherical, and a material of the particle is metal or polystyrene.

Referring to FIG. 1, a first conductive layer 103 is provided between the carrier substrate 100 and the separation layer 101, and a second conductive layer 104 is provided between the flexible substrate 200 and the deformable layer 102. A material of the deformable layer 102 is a piezoelectric deformable material. When there is a preset voltage difference between the first conductive layer 103 and the second conductive layer 104, the deformable layer 102 shrinks and deforms. Under the support of the separation layer 101, a side of the deformable layer 102 close to the carrier substrate 100 breaks away from the carrier substrate 100, so that the flexible substrate 200 is separated from the carrier substrate 100. After separation, the spherical separation layer is still attached to the outside surface of the deformable layer 102, so that light scattering can be enhanced and the light-outgoing effect of the flexible display device can be improved.

The piezoelectric deformable material is polyvinylidene fluoride (PVDF), and the preset voltage difference ranges from 10V to 30V, for example, the preset voltage difference may be 25V. The piezoelectric material has two properties, one is that an electric field is generated due to mechanical deformation, and the other is that mechanical deformation occurs due to the electric field. The former is called the positive piezoelectric effect, and the latter is called the converse piezoelectric effect. In this embodiment, the converse piezoelectric effect is utilized, so that the piezoelectric material is deformed under the action of an external electric field. In addition, the deformation is divided into stretching and shrinking, and the piezoelectric material in this embodiment has shrinkage characteristics.

The flexible display motherboard of the present embodiment includes a carrier substrate, a separation layer provided above the carrier substrate, a first conductive layer arranged between the carrier substrate and the separation layer, a piezoelectric deformable layer provided on the separation layer, a flexible substrate provided above the piezoelectric deformable layer, a second conductive layer provided between the flexible substrate and the piezoelectric deformable layer, and a display device provided on the flexible substrate. When a predetermined voltage difference is applied, the piezoelectric deformable layer shrinks and deforms to separate the flexible substrate from the carrier substrate. In this embodiment, the flexible substrate can be simply and conveniently separated from the carrier substrate without any damage to the display element, and the light-outgoing effect of the flexible display device can also be improved.

Figure 2:
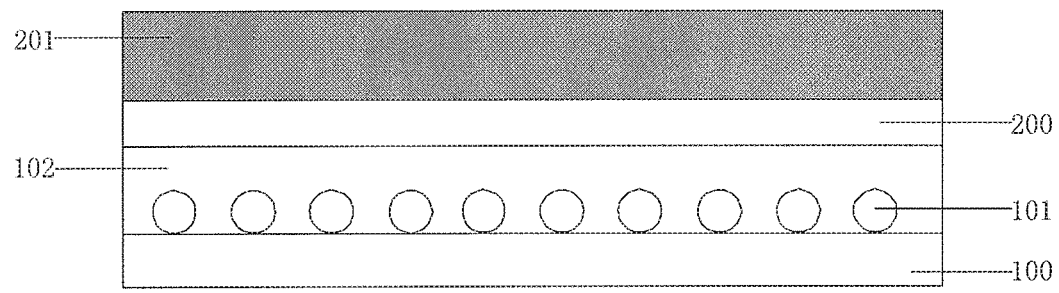
FIG. 2 is a schematic diagram of a structure of a flexible display motherboard according to an embodiment of the present disclosure.

FIG. 2 is a schematic diagram of a structure of a flexible display motherboard according to an embodiment of the present disclosure. As shown in FIG. 2, the flexible display motherboard includes a carrier substrate 100, a separation layer 101 disposed on the carrier substrate 100, a deformable layer 102 covering the separation layer 101, a flexible substrate 200 disposed on the deformable layer 102, and a display device 201 disposed on the flexible substrate 200, wherein the deformable layer 102 shrinks and deforms under a preset triggering condition to separate the flexible substrate 200 from the carrier substrate 100. In this embodiment, the flexible substrate 200 can be separated from the carrier substrate 100 easily and conveniently without any damage to the display element, and the light-outgoing effect of the flexible display device can also be improved.

In this embodiment, the separation layer 101 includes a plurality of particles. The shape of the particle in the separation layer 101 may be any shape as long as such a shape can separate the flexible substrate 200 from the carrier substrate. Optionally, the shape of the particle may be spherical, and a material of the particles is metal or polystyrene.

In the present embodiment, a material of the deformable layer 102 is a temperature deformable material. The deformable layer 102 shrinks and deforms at a preset temperature. Under the support of the separation layer 101, a side of the deformable layer 102 close to the carrier substrate 100 breaks away from the carrier substrate 100, so that the flexible substrate 200 is separated from the carrier substrate 100. After separation, the spherical separation layer is still attached to the outside surface of the deformable layer 102, so that light scattering can be enhanced and the light-outgoing effect of the flexible display device can be improved.

Optionally, the temperature deformable material is $Sc_2W_3O_{12}$, $Mn_3ZnN$, or $ZrW_2O_8$. Optionally, the preset temperature ranges from −263° C. to 927° C. Optionally, the preset temperature ranges from 100° C. to 200° C. Furthermore, when the preset temperature is 120° C., the deformable layer 102 shrinks and deforms, so that the flexible substrate can be simply and conveniently separated from the carrier substrate without any damage to the display element. The flexible substrate may be separated from the carrier substrate by the temperature in the embodiment without any damage to the display element.

The flexible display motherboard of the present embodiment includes a carrier substrate, a separation layer disposed above the carrier substrate, a deformable layer disposed on the separation layer, a flexible substrate disposed above the deformable layer, and a display device disposed on the flexible substrate. The deformable layer shrinks and deforms at a preset temperature to separate the flexible substrate from the carrier substrate. In this embodiment, the flexible substrate can be separated from the carrier substrate simply and conveniently without any damage to the display element, and the light-outgoing effect of the flexible display device can also be improved.

Figure 3:
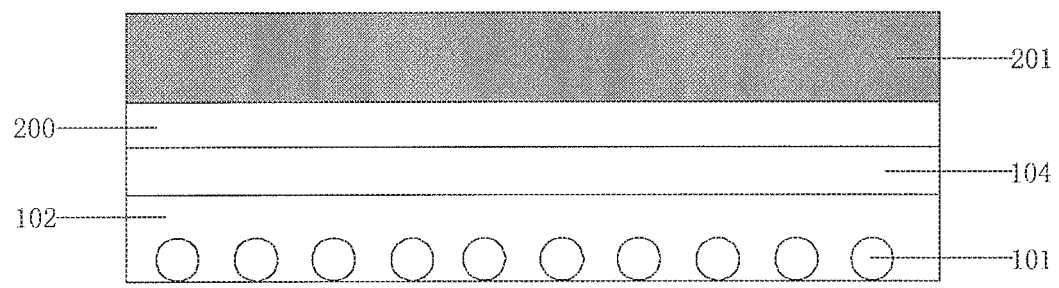
FIG. 3 is a schematic diagram of a structure of a flexible display substrate according to an embodiment of the present disclosure.

FIG. 3 is a schematic diagram of a structure of a flexible display substrate according to an embodiment of the present disclosure. As shown in FIG. 3, the flexible display substrate includes a flexible substrate 200 with a display device 201 on a first surface thereof and a deformable layer 102 on a second surface thereof, and a separation layer 101 is disposed on the deformable layer 102. The deformable layer 102 shrinks and deforms under a preset triggering condition to separate the flexible substrate 200 from the carrier substrate. In this embodiment, the flexible substrate 200 can be separated from the carrier substrate simply and conveniently without any damage to the display element, and the light-outgoing effect of the flexible display device can also be improved.

In this embodiment, the separation layer 101 includes a plurality of particles. A shape of the particle in the separation layer 101 may be any shape as long as such a shape can separate the flexible substrate 200 from the carrier substrate. Optionally, the shape of the particles may be spherical, and a material of the particle is metal or polystyrene.

In the flexible display motherboard shown in FIG. 1, after the separation of the flexible substrate from the carrier substrate, the flexible display substrate of the present embodiment is formed. Therefore, the structural features of the flexible display substrate of the present embodiment one-to-one correspond to the structural features of the flexible display motherboard shown in FIG. 1, respectively. The specific structure of the flexible display motherboard may refer to the embodiment shown in FIG. 1, and the details thereof are omitted herein. After separation, the second conductive layer still remains between the flexible substrate 200 and the deformable layer 102, and the spherical separation layer is still attached to the outside surface of the deformable layer 102, so that light scattering can be enhanced and the light-outgoing effect of the flexible display device can be improved.

The flexible display substrate of the present embodiment includes a flexible substrate with a display device on the first surface thereof and a piezoelectric deformable layer on the second surface thereof, a second conductive layer disposed between the flexible substrate and the piezoelectric deformable layer, and a separation layer disposed on the piezoelectric deformable layer. When a predetermined voltage difference is applied, the piezoelectric deformable layer shrinks and deforms to separate the flexible substrate from the carrier substrate. In this embodiment, the flexible substrate can be separated from the carrier substrate simply and conveniently without any damage to the display element, and the light-outgoing effect of the flexible display device can also be improved.

Figures 4, 5:
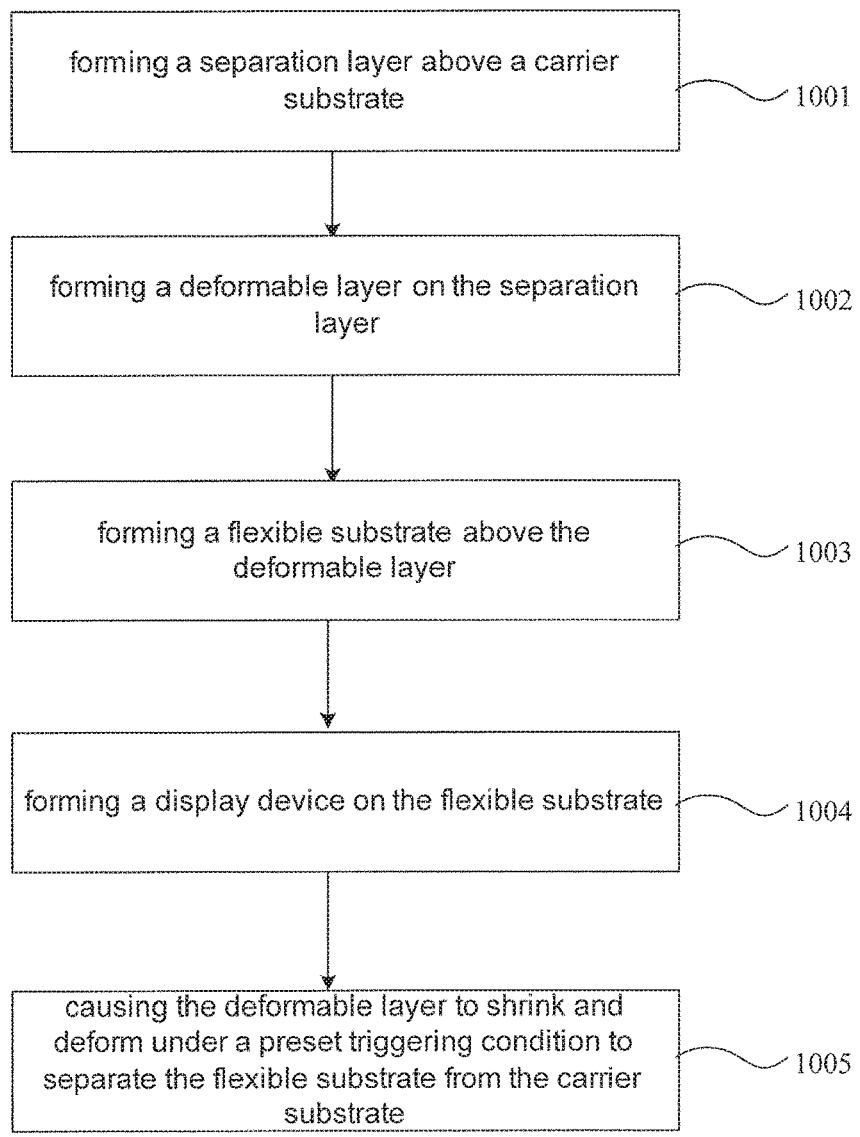
FIG. 4 is a structural diagram of a structure of a flexible display substrate according to an embodiment of the present disclosure.
FIG. 5 is a flowchart for illustrating a method for manufacturing a flexible display substrate according to an embodiment of the present disclosure.

FIG. 4 is a schematic diagram of a structure of a flexible display substrate according to an embodiment of the present disclosure. As shown in FIG. 4, the flexible display substrate includes a flexible substrate 200 with a display device 201 on a first surface thereof and a deformable layer 102 on a second surface thereof, and a separation layer 101 disposed on the deformable layer 102. The deformable layer 102 shrinks and deforms under a preset triggering condition to separate the flexible substrate 200 from the carrier substrate. In this embodiment, the flexible substrate 200 can be separated from the carrier substrate simply and conveniently without any damage to the display element, and the light-outgoing effect of the flexible display device can also be improved.

In this embodiment, the separation layer 101 includes a plurality of particles. A shape of the particle in the separation layer 101 may be any shape as long as such a shape can separate the flexible substrate 200 from the carrier substrate. Optionally, the shape of the particle may be spherical, and a material of the particle is metal or polystyrene.

In the flexible display motherboard shown in FIG. 2, after the separation of the flexible substrate from the carrier substrate, the flexible display substrate of the present embodiment is formed. Therefore, the structural features of the flexible display substrate of the present embodiment correspond to the structural features of the flexible display motherboard shown in FIG. 2. The specific structure of the flexible display motherboard may refer to the embodiment shown in FIG. 2, and the details thereof are omitted herein. After separation, the spherical separation layer is still attached to the outside surface of the deformable layer, so that light scattering can be enhanced and the light-outgoing effect of the flexible display device can be improved.

The flexible display substrate of the present embodiment includes a flexible substrate with a display device on a first surface thereof and a deformable layer on a second surface thereof, and a separation layer disposed on the deformable layer. The deformable layer shrinks and deforms at a preset temperature to separate the flexible substrate from the carrier substrate. In this embodiment, the flexible substrate can be separated from the carrier substrate simply and conveniently without any damage to the display element, and the light-outgoing effect of the flexible display device can also be improved.

FIG. 5 is a flowchart illustrating a method for manufacturing a flexible display substrate according to an embodiment of the present disclosure. As shown in FIG. 5, a method for manufacturing a flexible display substrate includes:

Step 1001: forming a separation layer above a carrier substrate;

Step 1002: forming a deformable layer on the separation layer;

Step 1003, forming a flexible substrate above the deformable layer;

Step 1004, forming a display device on the flexible substrate; and

Step 1005, causing the deformable layer to shrink and deform under a preset triggering condition to separate the flexible substrate from the carrier substrate.

In an embodiment, a material of the deformable layer is a piezoelectric deformable material. The step of forming the separation layer above the carrier substrate includes: forming a first conductive layer on the carrier substrate; and forming the separation layer on the first conductive layer. The step of forming the flexible substrate above the deformable layer includes: forming a second conductive layer on the deformable layer; and forming the flexible substrate on the second conductive layer. The step of causing the deformable layer to shrink and deform under the preset triggering condition includes: causing the deformable layer to shrink and deform by applying a preset voltage difference between the first conductive layer and the second conductive layer. In this embodiment, the flexible substrate can be separated from the carrier substrate simply and conveniently without any damage to the display element, and the light-outgoing effect of the flexible display device can be improved.

Referring to FIG. 1, according to the present embodiment, the first conductive layer 103 is formed on the carrier substrate 100 by sputtering or evaporation. A material of the carrier substrate 100 may be a rigid material, for example, glass. A material of the first conductive layer 103 may be a conductive material, for example, metal, ITO, or IZO and the like. In the present embodiment, the separation layer 101 is formed on the first conductive layer 103, particularly, metal balls are formed by sputtering, or polystyrene balls are formed in a self-assembly way to form the separation layer 101, or a spherical separation layer is formed by spraying. The so-called self-assembly refers to a technology in which basic structural units, for example, molecules, nano-material, microns scale or larger scale material, form ordered structure spontaneously. In the process of self-assembly, the basic structural units spontaneously organize or aggregate into a structure that is stable and has a substantially regular geometric structure under a non-covalent bond interaction.

In this embodiment, the deformable layer 102 is formed on the separation layer 101 by using a coating method. A piezoelectric deformable material of the deformable layer 102 is PVDF, and the predetermined voltage difference ranges from 10 V to 30V, For example, the preset voltage difference may be 25V. The piezoelectric material has two properties, one is that an electric field is generated due to mechanical deformation, and the other is that mechanical deformation occurs due to the electric field. The former is called the positive piezoelectric effect, and the latter is called the converse piezoelectric effect. In this embodiment, the converse piezoelectric effect is utilized, so that the piezoelectric material is deformed under the action of an external electric field. In addition, the deformation is divided into stretching and shrinking, and the piezoelectric material in this embodiment has shrinkage characteristics.

In the present embodiment, the second conductive layer 104 is formed on the deformable layer 102. If a flexible OLED display device emitting light from the bottom is prepared, the second conductive layer 104 should be transparent or translucent, and may be made of Mg/Ag, ITO or IZO and the like. If a flexible OLED display device emitting light from the top is prepared, a material of the second conductive layer 104 may be only conductive regardless of transparency. Subsequently, the flexible substrate 200 is prepared, and a material thereof may be any one of polyimide, polystyrene, and polypropylene polyester. Finally, a display device 201 is prepared. The display device 201 includes a thin film transistor, a driving circuit, a color film, a black matrix, a light emitting unit and an encapsulation layer, and the like. According to the present embodiment, by applying a voltage difference between the first conductive layer 103 and the second conductive layer 104, the deformable layer 102 shrinks until it does not directly contact with the first conductive layer 103, so that the contact between the spherical separation layer and the first conductive layer 103 belongs to a point contact substantially, and the separation can be easily achieved, thereby separating the flexible substrate 200 from the carrier substrate 100 without any damage to the display element, which improves the light-outgoing effect of the flexible display device.

Optionally, a material of the deformable layer may also be a temperature deformable material, and the step of causing the deformable layer to shrink and deform under a preset triggering condition includes: causing the deformable layer to shrink and deform at a preset temperature. Referring to FIG. 4, the material of the deformable layer 102 is a temperature deformable material, and the deformable layer 102 shrinks and deforms at a preset temperature. Under the support of the separation layer 101, a side of the deformable layer 102 close to the carrier substrate 100 breaks away from the carrier substrate 100, so that the flexible substrate 200 is separated from the carrier substrate 100. After separation, the spherical separation layer is still attached to the outside surface of the deformable layer 102, so that light scattering can be enhanced and the light-outgoing effect of the flexible display device can be improved.

The temperature deformable material is $Sc_2W_3O_{12}$, $Mn_3ZnN$, or $ZrW_2O_8$. The preset temperature ranges from −263° C. to 927° C. Optionally, the preset temperature ranges from 100° C. to 200° C. Furthermore, when the preset temperature is 120° C., the deformable layer 102 shrinks and deforms, so that the flexible substrate can be simply arid conveniently separated from the carrier substrate without any damage to the display element. In this embodiment, the flexible substrate may be separated from the carrier substrate without any damage to the display element.

In the method for manufacturing a flexible display substrate according to the embodiment of the present disclosure, a separation layer is formed above the carrier substrate, a deformable layer is formed on the separation layer, a flexible substrate is formed above the deformable layer, and a display device is formed on the flexible substrate, wherein the deformable layer shrinks and deforms under a preset triggering condition to separate the flexible substrate from the carrier substrate. In this embodiment, the flexible substrate can be separated from the carrier substrate simply and conveniently without any damage to the display element, and the light-outgoing effect of the flexible display device can be improved.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and spirit of the present disclosure, which are also to be regarded as the scope of the present disclosure.

What is claimed is:

1. A method for manufacturing a flexible display substrate, comprising:
    forming a separation layer above a carrier substrate;
    forming a deformable layer on the separation layer;
    forming a flexible substrate above the deformable layer; and
    forming a display device on the flexible substrate;

wherein the deformable layer between the carrier substrate and the flexible substrate is separated from the carrier substrate by shrinking and deforming the deformable layer under a preset triggering condition, so that the flexible substrate is separated from the carrier substrate and the separation layer is exposed; and the separation layer comprises a plurality of particles.

2. The method for manufacturing the flexible display substrate according to claim 1, wherein a material of the deformable layer is a piezoelectric deformable material, and wherein, the step of forming the separation layer above the carrier substrate comprises:
forming a first conductive layer on the carrier substrate; and
forming the separation layer on the first conductive layer;
the step of forming the flexible substrate above the deformable layer comprises:
forming a second conductive layer on the deformable layer; and
forming the flexible substrate on the second conductive layer, and
the step of shrinking and deforming the deformable layer under the preset triggering condition comprises:
shrinking and deforming the deformable layer by applying a preset voltage difference between the first conductive layer and the second conductive layer.

3. The method for manufacturing the flexible display substrate according to claim 2, wherein the piezoelectric deformable material is polyvinylidene fluoride.

4. The method for manufacturing the flexible display substrate according to claim 2, wherein the preset voltage difference ranges from 10V to 30V.

5. The method for manufacturing the flexible display substrate according to claim 1, wherein a material of the deformable layer is a temperature deformable material, and wherein the step of shrinking and deforming the deformable layer under the preset triggering condition comprises:
shrinking and deforming the deformable layer at a preset temperature.

6. The method for manufacturing the flexible display substrate according to claim 5, wherein the temperature deformable material is $Sc_2W_3O_{12}$, $Mn_3ZnN$ or $ZrW_2O_8$.

7. The method for manufacturing the flexible display substrate according to claim 5, wherein the preset temperature ranges from −263° C. to 927° C.

8. The method for manufacturing the flexible display substrate according to claim 1, wherein a material of the plurality of particles is metal or polystyrene.

9. A flexible display substrate manufactured by the method for manufacturing the flexible display substrate according to claim 1, the flexible display substrate comprising:
the flexible substrate comprising a first surface and a second surface opposite to each other;
the display device provided on the first surface of the flexible substrate;
the deformable layer provided on the second surface of the flexible substrate; and
the separation layer provided in the deformable layer, wherein, the deformable layer is configured to shrink and deform under the preset triggering condition.

10. The flexible display substrate according to claim 9, further comprising:

a first conductive layer provided on the separation layer; and
a second conductive layer provided between the flexible substrate and the deformable layer,
wherein, a material of the deformable layer Is a piezoelectric deformable material, and the deformable layer is configured to shrink and deform when a preset voltage difference is applied between the first conductive layer and the second conductive layer.

11. The flexible display substrate according to claim 10, wherein the piezoelectric deformable material is polyvinylidene fluoride.

12. The flexible display substrate according to claim 9, wherein a material of the deformable layer is a temperature deformable material, and the deformable layer is configured to shrink and deform at a preset temperature.

13. The flexible display substrate according to claim 12, wherein the temperature deformable material is $Sc_2W_3O_{12}$, $Mn_3ZnN$ or $ZrW_2O_8$.

14. The flexible display substrate according to claim 9, wherein the separation layer comprises a plurality of particles.

15. The flexible display substrate according to claim 14, wherein a material of the plurality of particles is metal or polystyrene.

16. The flexible display substrate according to claim 14, wherein each of the plurality of particles is spherical.

17. A flexible display motherboard comprising:
a carrier substrate;
a separation layer provided above the carrier substrate;
a deformable layer provided on the separation layer;
a flexible substrate provided above the deformable layer; and
a display device provided on the flexible substrate,
wherein the deformable layer between the carrier substrate and the flexible substrate is separated from the carrier substrate by shrinking and deforming the deformable layer under a preset triggering condition, so that the flexible substrate is separated from the carrier substrate, and the separation layer is exposed; and
the separation layer comprises a plurality of particles.

18. The flexible display motherboard according to claim 17, further comprising:
a first conductive layer provided between the carrier substrate and the separation layer; and
a second conductive layer provided between the flexible substrate and the deformable layer,
wherein, a material of the deformable layer Is a piezoelectric deformable material, and the deformable layer is configured to shrink and deform when a preset voltage difference is applied between the first conductive layer and the second conductive layer.

19. The flexible display motherboard according to claim 17, wherein a material of the deformable layer is a temperature deformable material, and the deformable layer is configured to shrink and deform at a preset temperature.

20. The method for manufacturing the flexible display substrate according to claim 1, wherein
forming the deformable layer on the separation layer comprises forming the deformable layer in a gap between at least two of the plurality of particles.

* * * * *